United States Patent [19]

Yamada et al.

[11] Patent Number: 4,460,998
[45] Date of Patent: Jul. 17, 1984

[54] SEMICONDUCTOR MEMORY DEVICES

[75] Inventors: Junzo Yamada, Iruma; Tsuneo Mano, Kodaira; Junichi Inoue, Chofu, all of Japan

[73] Assignee: Nippon Telegraph & Telephone Public Corporation, Tokyo, Japan

[21] Appl. No.: 356,041

[22] Filed: Mar. 8, 1982

[30] Foreign Application Priority Data

Mar. 11, 1981 [JP] Japan .................................. 56-34799

[51] Int. Cl.³ ........................ G06F 11/10; G06F 11/00
[52] U.S. Cl. ..................................... 371/10; 365/200
[58] Field of Search .......................... 371/10; 365/200

[56] References Cited
U.S. PATENT DOCUMENTS 3,434,116 3/1969 Anacker ............................ 371/10 X
3,544,777 12/1970 Winkler ................................. 371/10
3,898,443 8/1975 Smith ................................... 371/10

Primary Examiner—Charles E. Atkingson
Assistant Examiner—Mark Ungerman
Attorney, Agent, or Firm—Charles E. Pfund

[57] ABSTRACT

In addition to a main memory device a spare memory device is provided. Both memory devices utilize word wires in common which are arranged to constitute matrix circuits together with groups of bit lines. When a bit error is contained in data read out from the main memory device, a correction circuit correcting the error and a register for storing the error are provided. An output of the register is used to switch a bit line from which the error has been detected to a corresponding bit line of the spare memory device.

7 Claims, 18 Drawing Figures

FIG. 5A $\overline{RAS}$
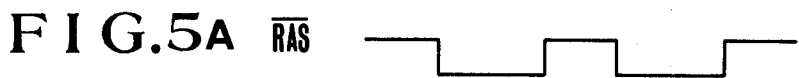
FIG. 5B AW
FIG. 5C $\phi_{RS}$
FIG. 5D $\phi_0$
FIG. 6A $\overline{RAS}$
FIG. 6B $\overline{RFSH}$
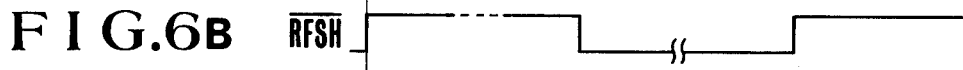
FIG. 6C $\phi_{CO}$
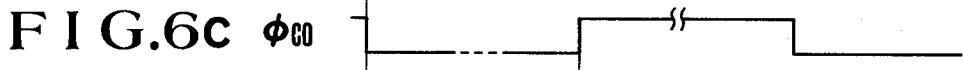
FIG. 6D $\phi_{WO}$
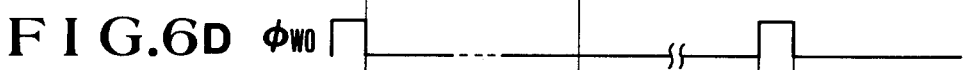
FIG. 6E RS
FIG. 6F $\phi_{G1}$
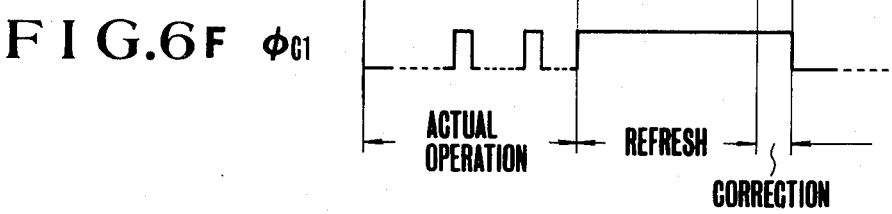
ACTUAL OPERATION — REFRESH — CORRECTION

SEMICONDUCTOR MEMORY DEVICES

BACKGROUND OF THE INVENTION

This invention relates to a semiconductor memory device capable of correcting errors.

With recent development of semiconductor technique researches have been concentrated to increase the capacity of the memory device by increasing the density thereof miniaturizing the same to increase the capacity, however, is accompanied by the following serious problems. More particularly, as the density increases, the yield of satisfactory products decreases due to defects such as pin hole. Moreover, soft errors as $\alpha$ rays occur thereby decreasing the reliability. Various redundancy techniques have been proposed to replace defective circuits by spare circuits at the time of manufacturing, while the soft errors have been obviated to some extent by making it possible to correct data. As the capacity increases in an LSI memory device (large scale integrated memory device) such as a large capacity dynamic type MOS RAM (metal oxide semiconductor random access memory device), the gate area increases considerably so that there is a tendency that the initial defective period becomes long.

When investigating a fault producing proceeding of such LSI memory device it was noted that the following three periods should be considered. Thus, the initial defective period or infant mortality period means a period of about 60,000 hours under a normal operation condition or about 100 hours under the application of high voltage after manufacturing, whereas a term, accidental fault period or useful life means a period of about several of 100,000 hours following the initial defective period. And the period following the accidental fault period is termed a wearout fault period. Among the causes of the faults may be mentioned a fault of a gate oxide film, a fault of bonding, and variations in the characteristics of MOS transistors. Such fault of the gate oxide film and faults associated therewith occur frequently at the beginning of the initial defective period and then decrease gradually, while the fault of bonding and faults associated therewith occur abundantly at the beginning of the initial defective period and then decrease gradually. The occurence of the faults of the aforementioned two types decreases after the initial defective period and occurs at a substantially constant rate. On the other hand, the variation in the characteristics of MOS transistors occurs at a relatively low rate during the initial defective period and the accidental fault period, but increases rapidly in the wearout fault period. Considering a memory device as a whole, the rate of occurrence of the fault is high at the beginning of the initial defective period and as the time elapses, the rate decreases gradually but the rate is low during the accidental fault period and increases in the wearout fault period.

Among these faults, those relating to the gate oxide film can remove the early stage fault by an acceleration test under applied voltage. In a dynamic RAM, a memory cell usually comprises one transistor and one capacitor and since a MOS capacitance is used at the cell capacitor, the fault regarding the gate oxide film increases with the capacity of the memory device. Accordingly, the initial defective period becomes longer than 60,000 hours. The fault regarding the bonding defect can be removed during a relatively early stage by an accelerated test under heat and humidity. The same is true for the dynamic type RAM. The variation in the chracteristics of a MOS transistor, for example faults regarding the threshold voltage $V_{th}$, the gain constant $\beta$, etc. occurs substantially constantly over a sufficiently long period up to the wearout fault period.

However, in a high density large capacity LSI memory device, the fault regarding the variation in the characteristics can not deal with a conventional MOS transistor. More particularly, the faults regarding the gate oxide film and the bonding are similar to the prior art faults, while the faults regarding the gate oxide film occurs such that they prolong the initial defective period, and the faults regarding bonding occur abundantly during the early period of the initial defective period. On the other hand, the faults regarding the variation in the characteristics begin to occur in a relatively early time because transistors constituting the memory device has been miniaturized, thus shortening the life of the LSI memory device. The principal cause that shortens the life of the LSI memory device lies in the shortening of the channel length of a transistor which decreases the breakdown strength thereof, in other words caused by the variation in the characteristics due to hot electron phenomenon. Variation in the characteristics caused by this phenomenon occurs frequently as the applied voltage increases. Consequently, in the case of an LSI memory device, even when the initial defects are removed by an accelerated test under voltage performed for the purpose of removing faults regarding the gate oxide film, the wearout fault period is reached before the effect of removing or screening the initial defects, thus rendering the LSI memory device inoperative. Thus this problem becomes serious when the capacity of the semiconductor memory device is increased beyond 1 M bits.

As above described, the screening of defects by an acceleration test under voltage is not effective for an LSI memory device utilizing miniaturized transistors so that a certain degree of the initial defective period is inevitable for such LSI memory device and VLSI (very large scaled integrated) memory devices.

When such initial defective period is admitted, potential defects appear gradually which correspond to use of a memory device in which fixed defects increase.

According to a prior art method when an error occurs during a read out mode the error of each bit is corrected. According to this method, however, the information bits read out of the memory device are corrected, the defects formed at the time of manufacturing remain in memory cells and moreover since new errors are added thereto the error of the memory device as a whole increases with time.

Where correction is made based on the decision of majority, a plurality of memory cells are assigned to one bit information so that when more than one half of the memory cells become defective it is impossible to correct erroneous information. Although it is possible to increase the number of the memory cells assigned to one bit for the purpose of decreasing the probability of the occurence of the error of one bit information, this measure decreases the density of integration. Accordingly, this method is not suitable to increase the capacity of the memory device.

SUMMARY OF THE INVENTION

Accordingly, it is an object of this invention to provide a semiconductor memory device having a self error correction capability such as soft error correction and correction of substituting fixed defects by spare means.

Another object of this invention is to provide a novel semiconductor memory device suitable to be used as LSI and VLSI memory devices having a high degree of integration.

Still another object of this invention is to provide a semiconductor memory device that can be manufactured at a high yield and having a sufficiently high reliability without performing an excessive acceleration test at the beginning of the use.

According to this invention, these and further objects can be achieved for correcting erroneous data by detecting erroneous operations caused by irreversible aging variation such as destruction of the gate oxide film, that is fixed defects and by automatically switching a defective circuit portion causing erroneous operations to a spare circuit.

According to this invention there is provided a semiconductor memory device of the type comprising a main memory device including a plurality of memory cells connected to cross points between first and second groups of lines which are arranged in a matrix circuit, means for reading out data stored in the memory cells in accordance with address designation signals and means for correcting an error contained in the read out data, characterized by comprising a spare memory device in which one of the groups of the lines and another group of lines are arranged in another matrix circuit, and the memory cells are connected to cross points of the another matrix circuits, and a correction control circuit including a plurality of registers which store information regarding presence or absence of an error when the error is contained in the read out data, and means for producing a correction signal based on output signals of the registers, the data reading out means including transfer switch means responsive to the correction signal for substituting one of the groups of lines of the main memory device from which an error has been detected by a selected one of the lines of the another group of the spare memory device.

BRIEF DESCRIPTION OF THE DRAWINGS

In the accompanying drawings

FIGS. 5A through 5D and FIGS. 6A through 6F are timing charts showing waveforms useful to explain the operation of the memory device shown in FIG. 1;

DESCRIPTION OF THE PREFERRED EMBODIMENTS

Figures 1, 1A:
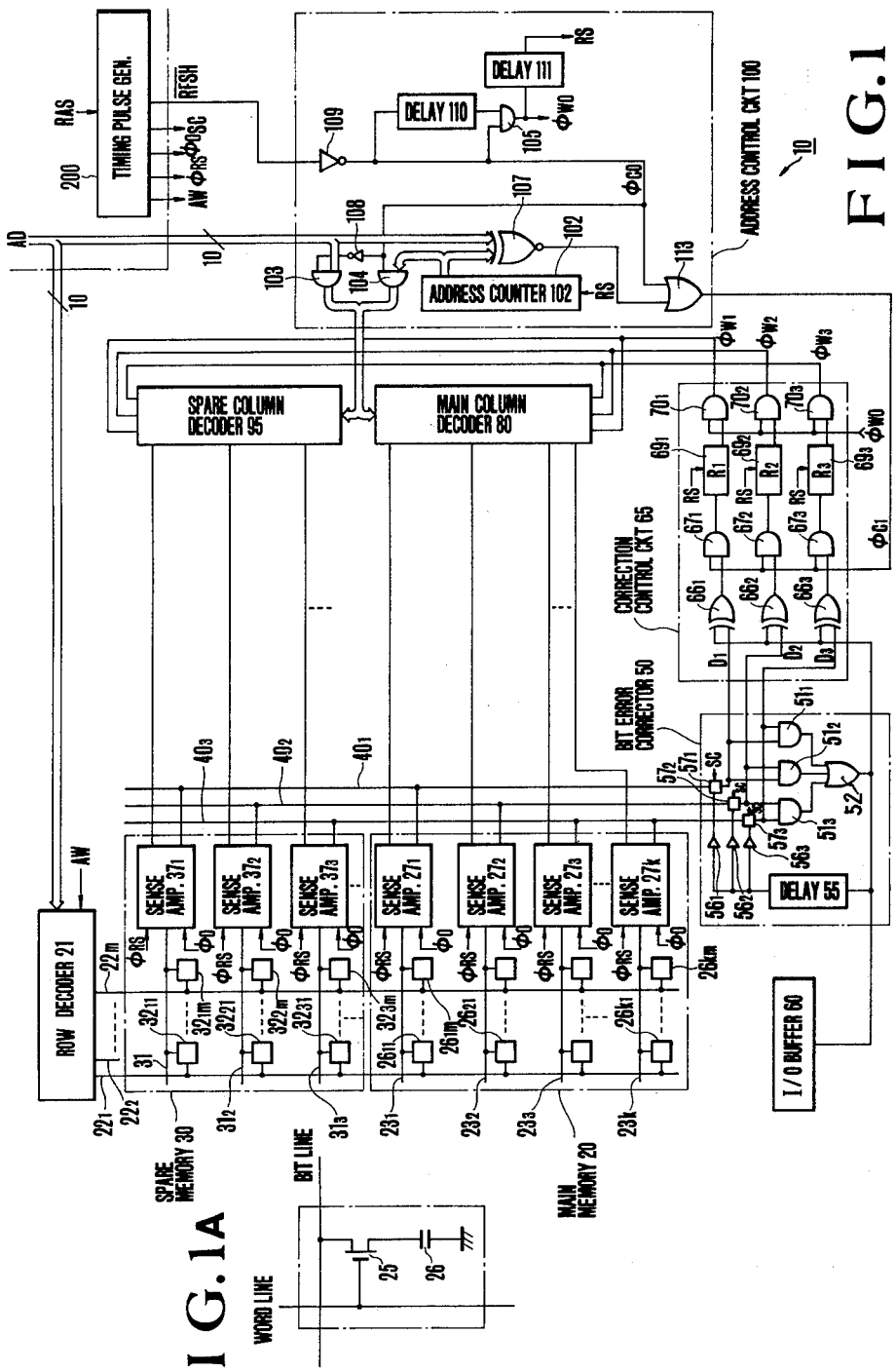
FIG. 1 is a block diagram showing one embodiment of the semiconductor memory device constructed according to the teaching of this invention.
FIG. 1A is a connection diagram showing one example of a memory cell shown in FIG. 1.

FIG. 1 shows one embodiment of the semiconductor device of this invention having a bit error correction capability based on the decision of majority. In this example, three memory cells are assigned to one bit information so that the decision of majority of three values of the three memory cells is used. The memory device 10 comprises a main memory device 20 and a spare memory device 30 which utilize in common word lines (row lines $22_1$, $22_2$...$22_m$ derived out from a row decoder 21. In the main memory device 20 bit lines (column lines) $23_1$, $23_2$...$23_k$ are arranged to cross the word lines to form a matrix circuit, whereas in the spare memory device 30, P bit lines $31_1$, $31_2$ and $31_3$...$31P$ are arranged to form a matrix circuit. However, in FIG. 1 three bit lines are typically represented.

At respective cross points between the word lines and the bit lines that constitute the main and spare memory device 20 and 30 are provided memory cells $26_{11}$, $26_{12}$...$26_{km}$, $32_{11}$, $32_{12}$...$32_{pm}$ respectively. In FIG. 1 the memory cells $32_{11}$, $32_{12}$...$32_{3m}$ of the spare memory device 30 are typically represented. A typical one of the memory cells is shown in FIG. 1A comprising a MOS type field effect transistor 25 and a capacitor 26 constituted by a well known MOS capacitance described above, the transistor 25 and the capacitor 26 being connected in series. One terminal of the capacitor 26 is connected to a common node (ex. ground) while the transistor 25 is connected to a bit line, and the gate electrode of the transistor 25 is connected to a word line.

Sense amplifiers $27_1$...$27_k$ are connected to respective bit lines $23_1$, $23_2$...$23_k$ of the main memory device 20. In the same manner, sense amplifiers $37_1$...$37_p$ are respectively connected to the bit lines $31_1$, $31_2$...$31_p$. In FIG. 1 only three sense amplifiers $37_1$–$37_3$ as components constituting the spare memory 30 are typically shown. These sense amplifiers have the same construction and operate to read out the contents of the memory cells selected by word lines upon receipt of bit selection signals from a column decoder to be described later. Where the decision of majority is used as a bit error correction circuit described later, it should be noted that the number of the bit lines and the same amplifiers constituting the spare memory device 30 is determined in accordance with the number of the data lines. For example, as used in the embodiment, where the decision of majority is performed by three values three bit lines and three sense amplifiers corresponding thereto are coupled as a set. In the most simple case the number of the bit lines and the sense amplifiers of the spare memory device 30 may be one (1).

Figure 2:
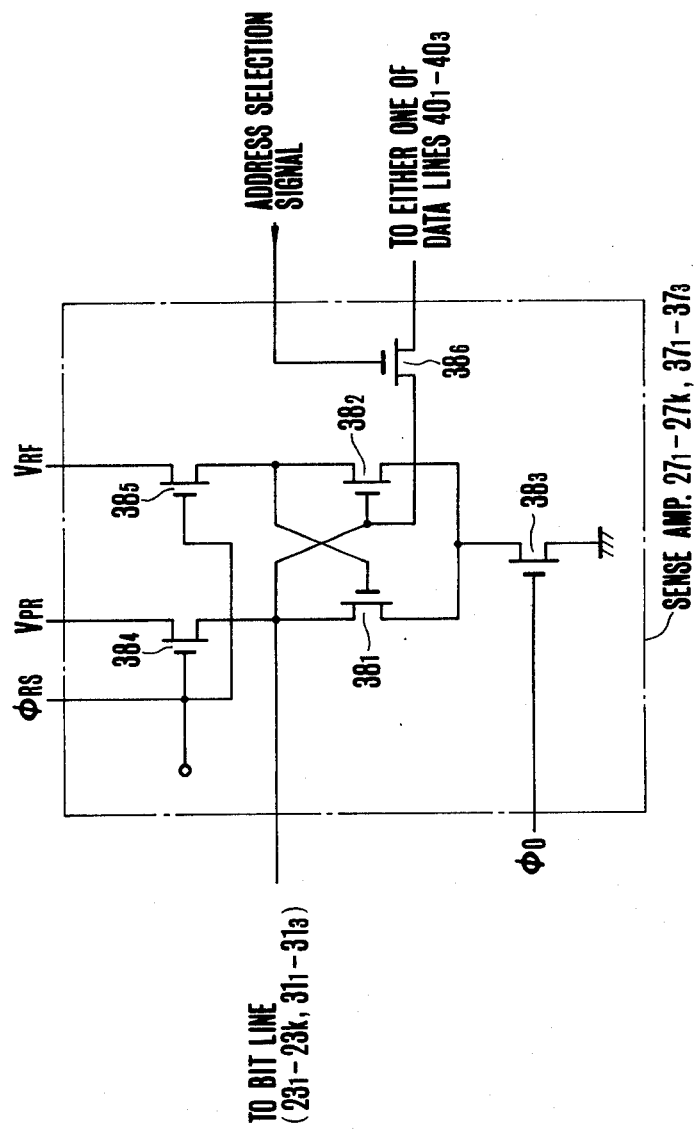
FIG. 2 is a connection diagram showing the detail of the sense amplifier shown in FIG. 1.

One example of the construction of the sense amplifier is shown in FIG. 2. As shown, it comprises 6 MOS field effect transistors $38_1$ through $38_6$, of which the source electrodes of transistors $38_1$ and $38_2$ are commonly connected and then grounded through transistor $38_3$. To the gate electrode of this transistor $38_3$ is applied a sense amplifier drive signal $\phi_0$ from a timing signal generator to be described later. The gate electrodes of transistors $38_1$, and $38_2$ are cross connected to the drain electrodes thereof, while the drain electrodes of transistors $38_1$ and $38_2$ are connected to a precharge source $V_{PR}$ and a reference source $V_{RF}$ respectively through transistors $38_4$ and $38_5$. The gate electrodes of transistors $38_4$ and $38_5$ are supplied with the some reset clock pulse $\phi_{RS}$, and the drain electrode of transistor $38_1$ is connected to a memory cell via a bit line. The drain electrode of transistor $38_1$ is connected to either one of the data lines $40_1$, $40_2$ and $40_3$ via transistor $38_6$. The gate electrode of transistor $38_6$ is supplied with an address selection signal from a main column decoder or a spare column decoder to be described later.

Accordingly, when a word line selected by the decoder 21 is driven by a word line drive signal $A_w$, the bit line voltage brought to the level of $V_{PR}$ by the clock pulse $\phi_{RS}$ varies slightly in accordance with the information (presence or absence of a charge in the capacitor 26) in a selected memory cell and then this variation is amplified by turning ON the MOS FET $38_3$ by the clock pulse $\phi_D$. For example, when the bit line voltage after aforementioned small variation is denoted by $V_{BL}$, and if $B_{BL} > V_{PR}$ the bit line voltage is set to a level corresponding to a logic value "1", whereas then $V_{BL} < V_{PR}$ the bit line voltage is set to a level corresponding to a logic value "0". The set data are sent to the data line via the MOS FET $38_6$. The relations between these signals $A_w$, $\phi_{RS}$ and $\phi_0$ and the main clock pulse $\overline{RAS}$ are shown in FIGS. 5A through 5D.

Data lines $40_1$, $40_2$ and $40_3$ send data read out from memory device 20 and 30 to a one bit error correction circuit 50 which determines three data bits sent over data lines $40_1$, $40_2$ and $40_3$ as a logic value "1" or "0" according to the decision of majority and write again these determined values or new external data into memory cells in the main memory device 20 or the spare memory device 30 via data lines $40_1$ through $40_3$. In other words the bit error correction circuit 50 corrects one bit error caused by $\alpha$ rays or fixed defects and inform the correction control circuit of whether or not one bit error occurs and where the error occurs.

In the embodiment, the bit error correction circuit 50 is constituted by three AND gate circuits $51_1$, $51_2$ and $51_3$, an OR gate circuit 52 supplied with the outputs of these AND gate circuits, a delay circuit 55 for delaying the output D4 of the OR gate circuit 52 for a predetermined time, for example 50 nano sec., buffer amplifiers $56_1$, $56_2$ and $56_3$ commonly supplied with the output of the delay circuit 55, and transfer switches $57_1$, $57_2$ and $57_3$ which switch the connection between the outputs of the buffer amplifiers $56_1$ to $56_3$ and the read out data from the data lines $40_1$ to $40_3$ in accordance with the presence or absence of a control signal SC. AND gate circuits $51_1$, $51_2$ and $51_3$ are connected to receive two of three outputs D1, D2 and D3 of the transfer switches $57_1$, $57_2$ and $57_3$ to obtain three values of the decision of majority.

When the data read out from the memory cells and supplied to data lines $40_1$, $40_2$ and $40_3$ via sense amplifiers coincide with each other, all AND gate circuits $51_1$, $51_2$ and $51_3$ produce coincidence outputs which are derived out as the output D4 via the OR gate circuit 52. After sending the output D4 to an external device via an I/O buffer 60, the transfer switches $57_1$–$57_3$ are supplied with a control signal SC from a timing pulse generator and the output D4 is fed back via delay circuit 55 and buffer amplifiers $56_1$, $56_2$ and $56_3$ and data lines and sense amplifiers to memory cells from which data have been read out to refresh the cells. The output D4 is also supplied to a correction control circuit 65 to be described later.

Where either one of the data on the data lines $40_1$, $40_2$ and $40_3$ read out from the memory cells via sense amplifiers is different from the other two data, for example D1="1", D2="1" and D3="0" due to occurence of an error, either two of the AND gate circuits $51_1$, $51_2$ and $51_3$ would not produce outputs. However, the remaining one produces an output which is derived out as the output D4 via the OR gate circuit 52. The refreshing operation of the output D4 is identical to that described above, and this output D4 is also sent to the correction control circuit 65.

The output of the bit error correction circuit 50 is sent to the external circuit via I/O buffer 60, the output thereof being sent to corresponding memory cells via delay circuit 55, buffer amplifiers $56_1$, $56_2$ and $56_3$, transfer switches $57_1$, $57_2$ and data lines $40_1$, $40_2$, $40_3$.

The correction control circuit 65 comprises a plurality of exclusive OR gate circuits $66_1$, $66_2$, $66_3$ each connected to receive one of the outputs D1, D2 and D3 of transfer switches $57_1$, $57_2$ and $57_3$, and the output of the error correction circuit 50, that is the output D4 of the OR gate circuit 52, AND gate circuits $67_1$, $67_2$, $67_3$ which send one of the outputs of the exclusive-OR gate circuits $66_1$, $66_2$, $66_3$ to succeeding stages according to an accumulation control signal $\phi_{c1}$ sent from an address control circuit to be described later, register $69_1$, $69_2$ and $69_3$ respectively storing the outputs of the AND gate circuits $67_1$, $67_2$ and $67_3$, and AND gate circuits $70_1$, $70_2$ ... which form correction signals $\phi_{w1}$, $\phi_{w2}$ and $\phi_{w3}$ in response to a correction control signal $\phi_{w0}$ produced by a correction control signal to be described later. Registers $69_1$, $69_2$ and $69_3$ are of the self hold type, that is they hold error signals, for example "1", stored therein until reset by a reset signal RS. The correction signals $\phi_{w1}$, $\phi_{w2}$ and $\phi_{w3}$ are supplied to a main column decoder 80 and a spare column decoder 95.

Figure 3:
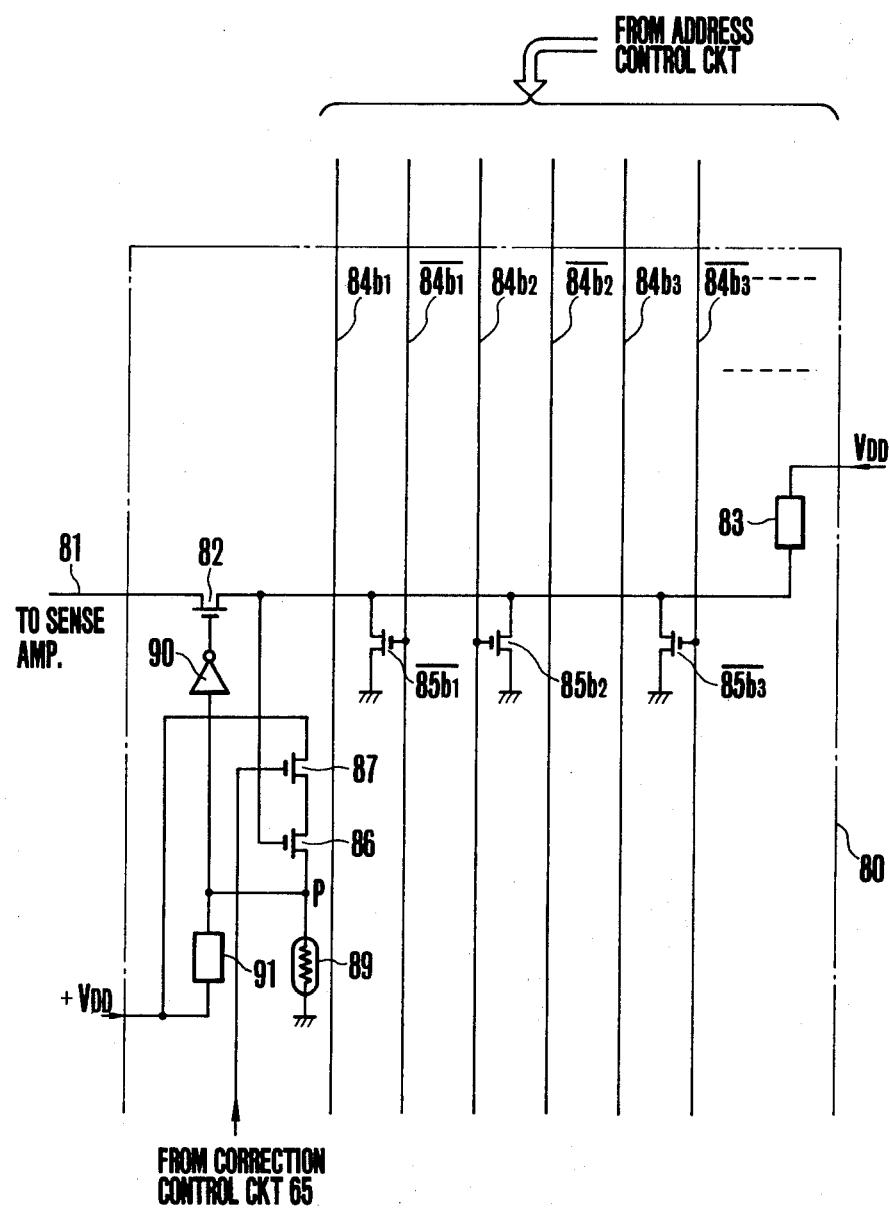
FIG. 3 is a connection diagram showing the detail of the main memory decoder shown in FIG. 1.

The constructions of one example each of the main column decoder 80 and the spare column decoder 95 will now be described with reference to FIGS. 3 and 4. As shown in FIG. 3, the main column decoder 80 comprises a data bit selection line 81 which is connected to the gate electrode of the FET $38_6$ (see FIG. 2) of the sense amplifier and also to a source $V_{DD}$ of +5V, for example, via an FET 82 and a load 83. A plurality of address designation lines $84_{b1}$, $84_{\overline{b1}}$ $84_{b2}$, $84_{\overline{b2}}$ ... are wired to cross the data bit line 81 to form a matrix circuit. These address designation lines comprise a plurality of pairs, and two lines of a pair are supplied with signals "1" and "0", respectively. In this example, between the data bit line 81 and the address designation lines $84_{\overline{b1}}$, $84_{b2}$ and $84_{\overline{b3}}$ are connected FET transistors $85_{\overline{b1}}$, $85_{b2}$ and $85_{\overline{b3}}$ each having one of their output electrodes and a gate electrode connected to the bit line and the address designation line. The other output electrodes of these FET transistors are connected to a common source (ground).

One electrode of the FET transistor 82 connected to the address designation line is connected to the control electrode of an FET transistor 86 which is connected in series with an FET transistor 87 and a fuse 89 of a well known construction which fuses or melts when a large current flows therethrough. One end of the fuse is grounded.

One electrode of FET transistor 87 is connected to a source $V_{DD}$ having a voltage of +5V, for example. The node P between the output electrode of transistor 86 and the fuse 89 is connected to the gate electrode of transistor 82 via inverter 90 and to the source $V_{DD}$ via a load 91. The gate electrode of transistor 87 is supplied with one of the outputs $\phi_{w1}$, $\phi_{w2}$ and $\phi_{w3}$ from the correction control circuit 65.

Normally, the node P between the load 91 and the fuse 89 is maintained at a low voltage determined by the source $+V_{DD}$ so that the input to the inverter 90 is at a low level and its output is at a high level. Accordingly, the transistor 82 is normally turned ON to send out a selection signal "1" or "0" depending upon a signal on the address designation line 84.

When supplied with one of the correction signals $\phi_{w1}$, $\phi_{w2}$ and $\phi_{w3}$ from the correction control circuit 65, the transistor 87 turns ON to pass large current through the fuse 89 from the source $V_{DD}$ via transistors 87 and 86 to interrupt the fuse 89. As a consequence, the potential at the node P between the load 91 and the fuse 89 becomes high to render the output of the inverter 90 to become low which turns OFF transistor 82, thus preventing a selection signal from being applied to a corresponding sense amplifier even when a signal is applied to the address designation line 84.

Figure 4:
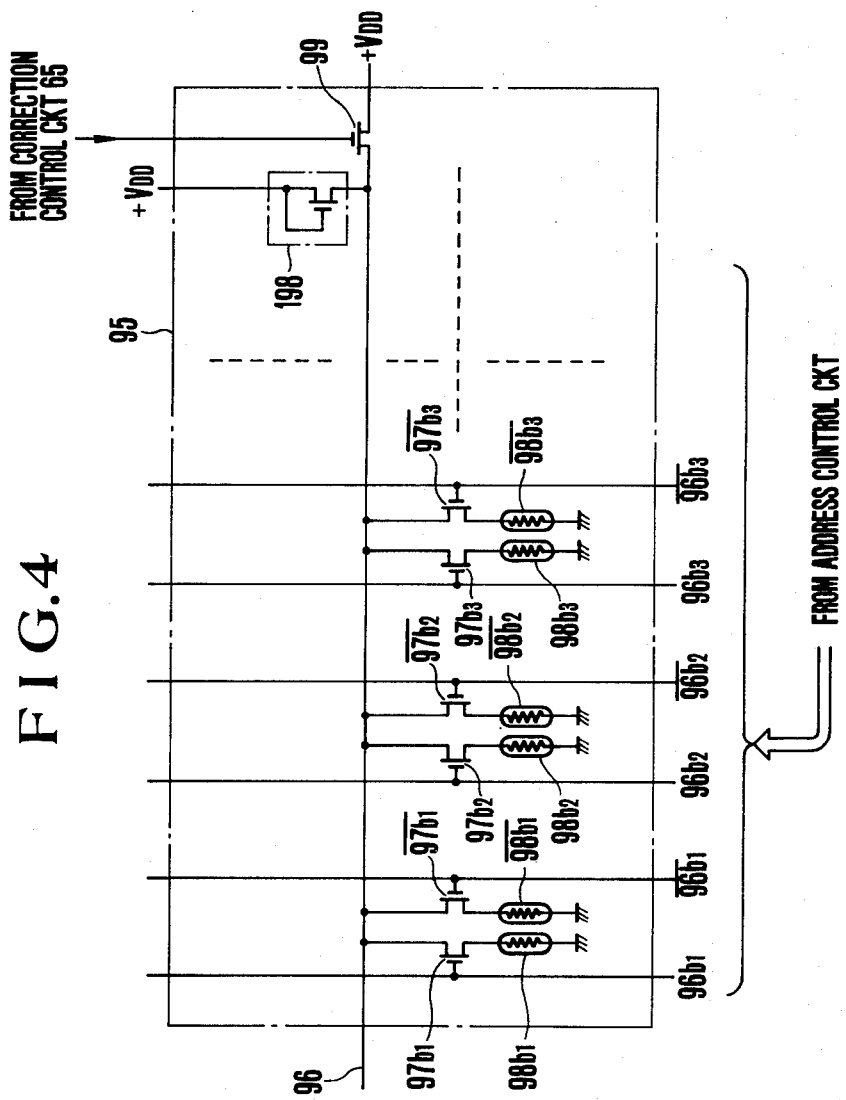
FIG. 4 is a connection diagram showing the detail of the spare memory decoder shown in FIG. 1.

FIG. 4 shows the construction of one example of the spare column decoder 95. Like FIG. 3, a single bit line 96 is shown as a representative. A bit line 96 connected to the gate electrode of an FET of the sense amplifier is connected to source $V_{DD}$ having a voltage of +5V, for example, and to a source $+V_{DD}$ via an FET transistor 99, the gate electrode thereof being applied with one of the correction signals $\phi_{w1}$, $\phi_{w2}$ and $\phi_{w3}$ from the correction control circuit 65. Address designation lines $84_{b1}$, $84_{\overline{b1}}$, $84_{b2}$, $84_{\overline{b2}}$ $84_{b3}$ $84_{\overline{b3}}$ each paired with the address designation line 84 of the main column decoder 80 cross the bit line 96 to form a matrix circuit. Between the bit line 96 and respective address designation lines $84_{b1}$, $84_{\overline{b1}}$, $84_{b2}$, $84_{\overline{b2}}$ . . . are connected one of the output electrodes of FET transistors $97_{b1}$, $97_{\overline{b1}}$, $97_{b2}$, $97_{\overline{b2}}$ . . . and the gate electrodes thereof, while the other output electrodes are connected to a common source (ground) respectively through fuses $98_{b1}$, $98_{\overline{b1}}$, $98_{b2}$, $98_{\overline{b2}}$ . . . . The bit line 96 is also connected to the source $+V_{DD}$ through a pull-up resister 198.

In the spare column decoder 95, fuses $98_{b1}$, $98_{\overline{b1}}$ . . . are normally at a low resistance state. Where this spare column decoder 95 is substituted for a bit line of the main column decoder 80 on which an error has occured, one of the correction signals $\phi_{w1}$, $\phi_{w2}$ and $\phi_{w3}$ from the correction control circuit 65 is applied to the gate electrode of transistor 99. At this time, the address designation signal is also applied to an address selection line selected by the address control circuit to turn ON transistor 97 connected to the selected address designation line so as to pass a large current from the source $V_{DD}$ through fuse 98 connected in series with transistors 99 and 97 to interrupt the fuse. The address of fuse 98 thus interrupted corresponds to that of the interrupted fuse of the main column decoder 80. Because the address designations of the spare column decoder 95 and the main column decoder 80 are made by the common designation line.

An address control circuit 100 which forms address informations supplied to the main column decoder 80 and the spare column decoder 95 will now be described. As shown in FIG. 1 the address control circuit 100 comprises an address counter 102 having 8-12 bits, preferably 10 bits, AND gate circuits 103, 104 and 105, an exclusive OR gate circuit 107, inverters 108 and 109, a delay circuit 110 and 111, and an OR gate circuit 113.

The control signals utilized in the address control circuit 100 are supplied from external circuits such as a central processing unit or a well known timing pulse oscillator. In this example, a timing pulse generator 200 is provided to generate various control signals. The generator 200 generates pulses shown in FIGS. 5A through 5D. Among these output pulses, the main clock pulses $\overline{RAS}$ shown in FIGS. 5A and 6A have a frequency of 5 MHz, for example. By using this clock pulse $\overline{RAS}$ as a reference, a word selection signal AW shown in FIG. 5B, a sense amplifier reset signal $\phi_{RS}$ shown in FIG. 5C, and a sense amplifier drive signal $\phi_0$ shown in FIG. 5D are formed. To the address control circuit 100 are applied 10 bits of an external address signal AD preferably having 20 bits from an external circuit.

The timing pulse generator 200 also supplies to the inverter 109 a refreshing control signal $\overline{RFSH}$ which is normally at the high level and becomes the low level during the refreshing period. The refreshing control signal $\overline{RFSH}$ is at the low level during the refreshing and the correction operations. As a consequence, the inverter 109 produces a high level output during the refreshing and the correction operations which operates as a transfer signal $\phi_{c0}$ shown in FIG. 6C. This transfer signal $\phi_{c0}$ is generated while (number of word lines +1) clock pulses are generated when it is assumed that one main clock pulse $\overline{RAS}$ is used to scan one word line.

The transfer signal $\phi_{c0}$ is applied to one input of AND gate circuit 105 and delay circuit 110 to cause the same to send a correction control signal $\phi_{w0}$ shown in FIG. 6D to the other input of the AND gate circuit 105 during the last one main clock pulse period in which the transfer signal $\phi_{c0}$ shown in FIG. 6C is being generated. This correction control signal $\phi_{w0}$ is sent to delay circuit 111 and delayed thereby by one half cycle of the main clock pulse. The delayed signal outputted from the delay circuit 111 as shown in FIG. 6E is applied to the correction control circuit 65 shown in FIG. 1 to act as a reset pulse RS and to the address counter 102 to act as an increment signal.

One of the inputs of each AND gate circuits 103 and 104 are supplied with an external address signal AD from an external circuit not shown, for example a central control unit. The AND gate circuit 103 is enabled when the transfer signal $\phi_{c0}$ is "0" that is during the actual operation time by the enabling signal "1" outputted by the inverter 108 to send the address signal AD to main column decoder 80 and the spare column decoder 95.

As shown in FIG. 6C when the transfer signal $\phi_{c0}$ becomes the low level to start the refreshing operation, the inverter 108 sends its "0" output to the AND gate circuit 103 to disenable the same. On the other hand, AND gate circuit 104 is enabled by the transfer signal $\phi_{c0}$ to supply the output of the address counter 102 to the decoders 80 and 95 to act as an address designation signal.

The address counter 102 counts up each time it receives the output shown in FIG. 6E of the delay circuit 111 to form parallel outputs which are supplied to the decoders 80 and 95 via AND gate circuit 104 to act as the address designation signal.

The external address signal AD and the parallel outputs of the address counter 102 are applied to exclusive-OR gate circuit 107 and its output is applied to the OR gate circuit 113 together with the transfer signal $\phi_{c0}$ to produce an accumulation control signal $\phi_{c1}$ at the timing shown in FIG. 6F. By the action of the output of the OR gate circuit 107, when the externally applied address coincides with the count of the counter, whether an error has occurred or not is stored in the register not only during the refreshing period but also during the actual operation.

The semiconductor memory device of this invention operates as follows.

In the read out mode, upon application of the external address signal AD, while the transfer signal $\phi_{c0}$ is at the low level, the address control circuit 100 supplies an address designation signal to the main column decoder 80 and the spare column decoder 95 so that these decoders select a predetermined bit line in accordance with a signal on a data bit selection line. At this time, since the row decoder 21 is also applied with a portion (10 bits) of a signal AD from the timing pulse generator 200 and the word drive signal AW so that the row decoder scans word lines 21, $22_2 \ldots 22_m$ based on these signals.

Accordingly, the content of the memory cell of the main memory device 20 or spare memory device 30 is read out where the selected word line and the bit line coincide with each other. In this example, since an error check is made by the decision of majority, the contents of one set of three memory cells connected to a common word line are read out onto data lines $40_1$, $40_2$ and $40_3$. The read out data are sent to the error correction circuit 50 where the error is corrected or eliminated according to the decision of majority, and the output signal D4 of the OR gate circuit thus obtained is the correct read out information sent to the I/O buffer 60. Further, a refreshing operation in a refreshing mode of the operation modes shown in FIGS. 6A–6F is effected. Thus, the output D4 is written again into the original memory cells associated with the word lines via the delay circuit 55, buffer amplifiers $56_1$ through $56_3$, transfer switches $57_1$ through $57_3$ and data lines $40_1$ through $40_3$.

Even when individual data read out onto data lines $40_1$–$40_3$ contains an error the output D4, that is the finally read out information is correct error free information so that this information will be applied to all data lines $40_1$, $40_2$ and $40_3$ through transfer switches $57_1$ through $57_3$ thus eliminating a one bit error.

According to this invention, any error can be eliminated in the following manner. Thus, the data on the data lines $40_1$, $40_2$ and $40_3$ are applied to the error correction circuit 50 by the control signal SC and the correction circuit 50 supplies its outputs D1, D2 and D3 to exclusive-OR gate circuits $66_1$, $66_2$ and $66_3$ which compare these outputs with the output 52 of the OR gate circuit D4, and when the compared outputs do not coincide with each other, either one of the exclusive-OR gate circuits $66_1$–$66_3$ produces an output, that is, detects an error. The detected signals are stored in registers $69_1$, $69_2$ and $69_3$ via AND gate circuits $67_1$, $67_2$ and $67_3$ respectively. The registers self-hold the error informations until reset by reset signal RS.

Then the correction control signal $\phi_{w0}$ from the address control circuit 100 is applied to one inputs of AND gate circuits $70_1$, $70_2$ and $70_3$ in the correction control circuit 65 to initiate a correction operation. This signal $\phi_{w0}$ continues for about 500 nano seconds following the completion of the refreshing operation to enable AND gate circuits $70_1$, $70_2$ and $70_3$ for sending out correction signals $\phi_{w1}$, $\phi_{w2}$ and $\phi_{w3}$ to the main decoder 80 and the spare decoder 95. When supplied with either one of the correction signals $\phi_{w1}$, $\phi_{w2}$ and $\phi_{w3}$, the decoder 80 replaces a bit line with cells and a sense amplifier in which the correction signal has generated with one column of the spare memory device of a corresponding bit line. According to this example, the operation of the main memory device 20 is stopped at a column corresponding to a memory cell of the main memory device 20 in which an error has occured. This stopping is made by passing a large current through an erroneous memory cell by the correction signal to melt a fuse. When supplied with the correction signal, the spare column decoder 95 passes a large current from the source $+V_{DD}$ via transistor 99 through a circuit similar to the circuit established for an erroneous memory cell of a bit line of the main memory cell 20. In the circuit shown in FIG. 3, since memory cells are connected to address designation lines $84_{\overline{b1}}$, $84_{\overline{b2}}$, $84_{\overline{b3}}$, the aforementioned large current is passed through the memory cells connected to address designation lines $84_{b1}$, $84_{b2}$ and $84_{b3}$ other than the address designation lines $96_{\overline{b1}}$, $96_{b2}$ and $96_{\overline{b3}}$ to interrupt the fuses. The output of the address counter 102 of the address control circuit 100 does not change until the accumulation of the erroneous operations and the error correction operations complete, and the count of the counter is incremented at a time shown in FIG. 6E immediately before the commencement of the next cycle.

As above described according to the semiconductor memory device of this invention, even when such circuit elements as memory cells, sense amplifiers, etc. of the main memory device become faulty, the faulty operations can be corrected without stopping the operation of the memory device. Accordingly, different from the prior art memory device, defects would not accumulate and hence it is not necessary to subject the memory device to excessive acceleration test at the beginning of the use. For this reason, it is possible to readily provide highly reliable and high density memory device. Moreover, it is possible to maintain the failure rate at a substantially constant value over a long period starting from the beginning of the use.

More particularly, suppose that a 1M bit MOS RAM is used and that the target failure rate is 1000 FITs. As the effective channel length is considered to be less than 1 micron, when one considers the hot electron durability, an acceleration test under voltage for eliminating initial defects can not be carried out with prior art technique. Accordingly, the failure rate becomes several times or more than that of the accidental defect period with the result that the initial defective period continues over several years as shown by curve (a) in FIG. 7.

Figure 7:
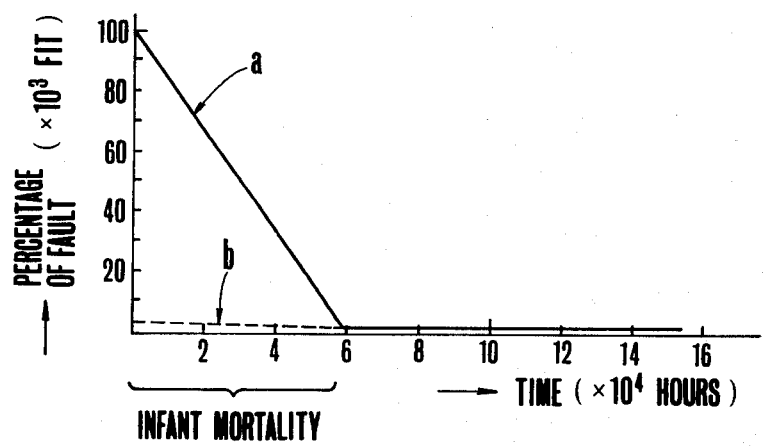
FIG. 7 is a graph comparing failure rate of the prior art memory device and of the memory device embodying the invention.

In contrast, according to this invention, the errors are corrected by the error correction circuit from the beginning of the use and the circuit elements of the main memory device which have become faulty are substituted by a corresponding line of the spare memory device so that accumulation of the errors does not occur and the rate of error of the memory device of this invention can be shown by curve (b) in FIG. 7.

The number of the bit lines of the spare memory device provided according to this invention may be the same as that of the faults during the initial defective period utilizing prior art technique. In a 1 Mb RAM of a capacity of 1024×1024, the number of faults during the initial defective period is about three. Accordingly, the spare memory may have only 1024×3 memory cells corresponding to three bit lines which is equal to about 0.3 % of the number of entire memory cells.

In a semiconductor memory device, a region impossible to be corrected may be defined as a "fatal region" and it is well known that the percentage of fatal region becomes small as the capacity of the memory device increases. For example, where each memory cell comprises a transistor, the percentage of the area of the gate oxide film of the fatal region is less than 1% in a 1 Mb RAM. Accordingly, in a semiconductor memory device of this invention of a 1 Mb RAM type having a high density of integrated circuits, it is possible to correct about 99% of the faults. The percentage of faults at the time of beginning the use is about 2000 FITs which is only 1/50 of about 100,000 FITs of the prior art.

The embodiment shown in FIG. 1 is constructed such that, each time an erroneous bit is detected by a bit error detection circuit, the error control circuit produces a correction signal. However, as has been pointed out in the introductory description, the erroneous operations of the memory device are caused by such fixed defects as defective gate oxide films, and variations in the characteristics of transistors, and by a temporary error caused by $\alpha$ rays, that is a soft error. Since the soft error extinguishes in a short time it is substantially corrected by the bit error corrector circuit 50.

Figure 8:
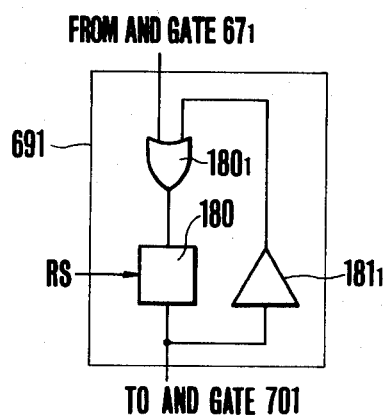
FIG. 8 is a block diagram showing a modification of a correction control circuit of this invention.

FIG. 8 shows one example of a self-holding type register 60$_1$. As shown an OR gate circuit 180$_1$ is connected between a register 68C and AND gate circuit 67$_1$ shown in FIG. 1, and the output of the register 680 is fed back to one input of the OR gate circuit 180$_1$ via an amplifier 181$_1$ so as to cause the register to self-hold its content until a next reset signal is applied. The register 680, for example, comprises a R-S flip-flop.

With this construction, even when a defective memory cell and a normal or not defective memory cell are connected to the same bit line, at a time when the defective memory cell is selected, data representing errors are stored in one of the registers 69$_1$, 69$_2$ and 69$_3$, and due to the self-holding function of the registers correction can be made even when correction is made after a normal memory cell has been selected.

Figure 9:
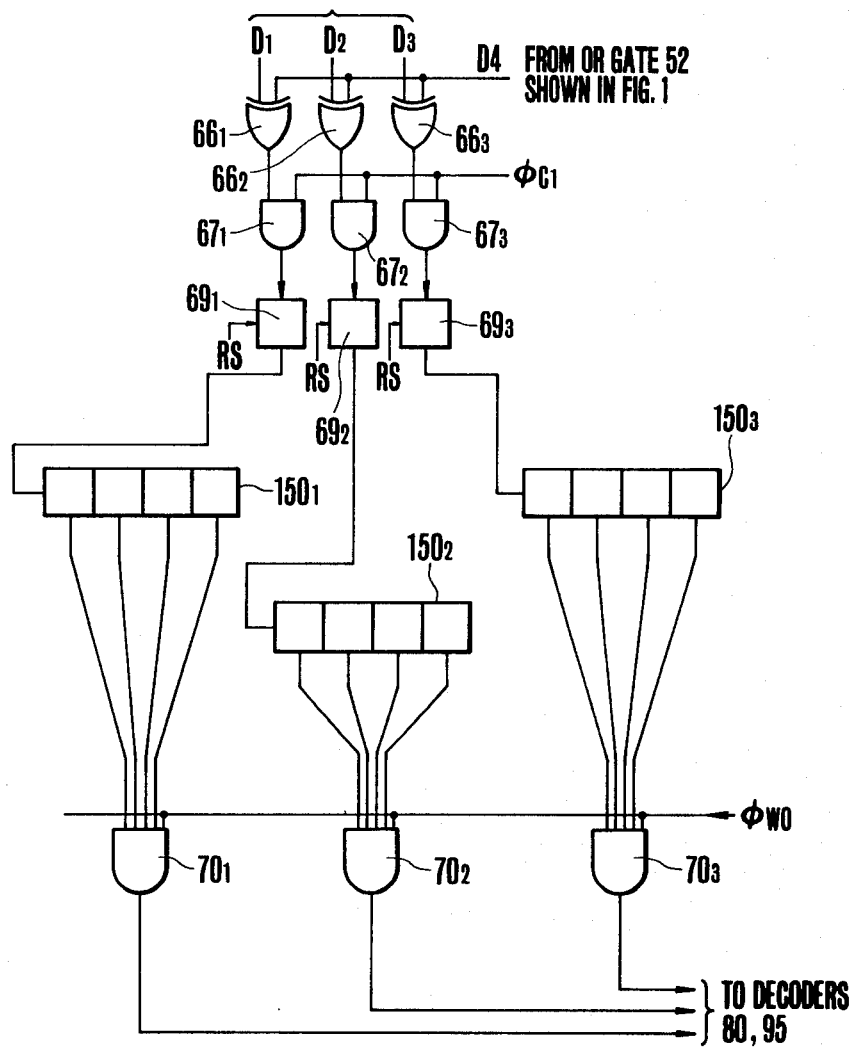
FIG. 9 is a block diagram showing a modification of a register utilized in the correction control circuit shown in FIG. 1.

FIG. 9 shows a modified embodiment of the semiconductor memory device of this invention, especially the detail of the correction control circuit thereof in which circuit elements identical to those shown in FIG. 1 are designated by the same reference numerals and in which three data lines are shown. However, since the circuit elements for respective data lines are identical, only those connected to the data line 40, are shown in detail. This modification is different from the embodiment shown in FIG. 1 in that a 4 stage/one-bit register 150$_1$ is added to the output side of the register 69$_1$ and the contents at respective stages of the register 150$_1$ are taken out parallelly and applied to the inputs of an AND gate circuit 70$_1$. With this connection, the accumulation of the informations regarding erroneous operations are made at four steps and the accumulated informations are once stored in the register 150$_1$ and only when the accumulation at four steps are completed, its logical product with the correction control signal is computed so that only when the counts at respective stages of the register coincide with each other, a correction signal is generated. Consequently, when 4 errors occur consecutively, it is judged that a fixed error has occurred thereby generating a correction signal whereas when the number of consecutive errors is less than 4, the error is judged as a soft error and no error signal is generated which enables more efficient utilization of the spare memory device.

The number of stages of the shift register 150$_1$ utilized in FIG. 8 is sufficient when it is larger than 2. As the number of stages increases, descrimination between the fixed defect and the soft error becomes accurate. Accordingly three stages are sufficient.

It should be understood that the invention is not limited to the specific embodiments described above, and that various changes and modification are obvious to one skilled in the art. Thus for example, the bit error correction circuit was constructed to operate based on the decision of majority it may be substituted by any well known correction circuit, example a horizontal/vertical parity check correction system in which a parity information consisting of (M+N) check bits are added to M×N information bits or a one bit error correction system in which (n+1) check bits are added to $2^n$ information bits.

Furthermore, instead of using a random access memory device for the main memory device a read only memory device ROM can be used. In this case too, the memory cells of the spare memory device are constituted by programmable transistor memory cells.

The fuses may be substituted by those disclosed in U.S. Pat. No. 4,146,902 in which the resistance values of the fuses irreversibly vary. In this case, since the operation of the fuse is reversed it is necessary to make a minor change of the circuit which can be made readily by one skilled in the art.

For example, it is necessary to satisfy the following three conditions.

1. An inverter 90 shown in FIG. 3 is substituted by a buffer.
2. An address signal utilized to write data in FIG. 4 is substituted by a complementary one (only at the time of writing).
3. Two types of correction signals are used, one for stopping the main decoder and the other for writing into the spare decoder (because both decoders use different address designation modes).

What is claimed is:

1. In a semiconductor memory device of the type comprising a main memory device including a plurality of memory cells connected to cross points between first and second groups of lines which are arranged in a matrix circuit, means for reading out data stored in said memory cells in accordance with address designation signals and means for correcting an error contained in the read out data, the improvement which comprises a spare memory device in which one of said groups of the lines and another group of lines are arranged in another matrix circuit and said memory cells are connected to cross points of said another matrix circuit, and correction control circuit including a plurality of registers which store information regarding presence or absence of an error when the error is contained in said read out data, means for producing a correction signal based on output signals of said registers, said data reading out means including transfer switch means responsive to said correction signal for substituting one of said groups of lines of said main memory device from which an error has been detected by a selected one of the lines of said another group of said spare memory device wherein said first group of lines comprises bit lines and said second group of lines comprises word lines, and further comprising means for producing address signals for said memory cells, and wherein said transfer switch means comprises a main decoder which selects said bit lines of said main memory device following said address signals, and a spare decoder for selecting said bit lines of said spare memory device in accordance with said address signals, said main decoder including means for interrupting said bit lines of said main memory device on which an error has occurred from its output side when said correction signal is applied to said main decoder, and said spare decoder including transfer means for substituting said bit lines of said main memory device interrupted from said output side with selected bit lines of said spare memory device such that said selected bit lines will have the same addresses as those of corresponding bit lines of said main memory device.

2. The semiconductor memory device according to claim 1 wherein each register includes a plurality of stages.

3. The semiconductor memory device according to claim 1 wherein each register is of the self-hold type.

4. The semiconductor memory device according to claim 1 wherein each memory cell is constituted by a memory element that can be rewritten.

5. The semiconductor memory device according to claim 1 wherein said correction control circuit operates based on a decision of majority and some of the memory cells connected to said word lines correspond to one bit data.

6. The semiconductor memory device according to claim 1 wherein said correction control circuit includes a circuit that stores a corrected output in an original memory cell from which erroneous data have been read out.

7. The semiconductor memory device according to claim 1 wherein said address signal generator comprises an address counter which counts up in synchronism with a timing of storing an error in a register and means for effecting switching between an output of said address counter and an external address signal in relation to a refreshing operation of said memory cells.

* * * * *

UNITED STATES PATENT AND TRADEMARK OFFICE
CERTIFICATE OF CORRECTION

PATENT NO. : 4,460,998

DATED : July 17, 1984

INVENTOR(S) : Junzo Yamada, Tsuneo Mano, and Junichi Inoue

It is certified that error appears in the above-identified patent and that said Letters Patent is hereby corrected as shown below:

Column 1, line 10: change "thereof miniaturizing" to
--thereof. Miniaturizing--

Column 5, line 18: change "whereas then" to
--whereas when--

Column 9, lines 47-8: change "output 52 of the OR gate circuit D4, " to
--output D4 of the OR gate circuit 52,--

Signed and Sealed this

Ninth Day of April 1985

[SEAL]

Attest:

DONALD J. QUIGG

Attesting Officer     Acting Commissioner of Patents and Trademarks